United States Patent
Chiba et al.

(10) Patent No.: US 11,484,878 B2
(45) Date of Patent: Nov. 1, 2022

(54) METHOD OF MANUFACTURING MICROCHANNEL CHIP

(71) Applicant: ZEON CORPORATION, Tokyo (JP)

(72) Inventors: Daido Chiba, Tokyo (JP); Kunihito Arai, Tokyo (JP); Taichi Sawaguchi, Tokyo (JP); Mitsukazu Aizawa, Tokyo (JP); Noriyuki Aritome, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 301 days.

(21) Appl. No.: 16/495,543

(22) PCT Filed: Mar. 14, 2018

(86) PCT No.: PCT/JP2018/010073
§ 371 (c)(1),
(2) Date: Sep. 19, 2019

(87) PCT Pub. No.: WO2018/180508
PCT Pub. Date: Oct. 4, 2018

(65) Prior Publication Data
US 2020/0094249 A1  Mar. 26, 2020

(30) Foreign Application Priority Data
Mar. 30, 2017  (JP) .............................. JP2017-068901

(51) Int. Cl.
*B01L 3/00*  (2006.01)

(52) U.S. Cl.
CPC . *B01L 3/502707* (2013.01); *B01L 2200/0689* (2013.01); *B01L 2300/0887* (2013.01); *B01L 2300/123* (2013.01)

(58) Field of Classification Search
None
See application file for complete search history.

(56) References Cited

U.S. PATENT DOCUMENTS 8,287,682 B2  10/2012  Kashiwagi et al.
9,989,494 B2   6/2018  Onuma
(Continued)

FOREIGN PATENT DOCUMENTS

CN  104849338 A  8/2015
JP  2006187730 A  7/2006
(Continued)

OTHER PUBLICATIONS

Oct. 1, 2019, International Preliminary Report on Patentability issued in the International Patent Application No. PCT/JP2018/010073.
(Continued)

*Primary Examiner* — Lore R Jarrett
(74) *Attorney, Agent, or Firm* — Kenja IP Law PC

(57) ABSTRACT

Disclosed is method of manufacturing a microchannel chip by joining together a resin channel substrate having microchannels formed on at least one side thereof and a resin lid substrate, the method including: a step (A) wherein surface modification treatment is applied on joining surfaces of the channel substrate and the lid substrate; and a step (B) wherein, after the step (A), the joining surfaces of the channel substrate and the lid substrate are mated and the channel substrate and the lid substrate are pressurized under heating via a fluid or an elastic body having a durometer hardness of E20 or less.

4 Claims, 1 Drawing Sheet

(56) References Cited

U.S. PATENT DOCUMENTS

| | | | |
|---|---|---|---|
| 2005/0271810 A1* | 12/2005 | Kobrin | B82Y 30/00 427/230 |
| 2009/0023833 A1* | 1/2009 | Taguchi | H01L 23/293 522/173 |
| 2009/0074615 A1 | 3/2009 | Moles | |
| 2009/0250163 A1* | 10/2009 | Kashiwagi | B29C 66/026 156/272.6 |
| 2012/0138461 A1 | 6/2012 | Sugiyama et al. | |
| 2015/0233865 A1 | 8/2015 | Onuma | |

FOREIGN PATENT DOCUMENTS

| | | |
|---|---|---|
| JP | 2011214838 A | 10/2011 |
| JP | 4998462 B2 | 8/2012 |
| JP | 2017001119 A | 1/2017 |

OTHER PUBLICATIONS

Jun. 12, 2018, International Search Report issued in the International Patent Application No. PCT/JP2018/010073.

Dec. 7, 2020, the Extended European Search Report issued by the European Patent Office in the corresponding European Patent Application No. 18775438.7.

* cited by examiner

[Unit: mm]

METHOD OF MANUFACTURING MICROCHANNEL CHIP

TECHNICAL FIELD

The present disclosure relates to methods of manufacturing a microchannel chip and, in particular, to methods of manufacturing a resin microchannel chip.

BACKGROUND

Recently, microchannel chips (chips having microchannels or reactors on the order of micrometers in size formed utilizing microprocessing techniques) have been used in various fields, including DNA testing, biological material analysis, drug discovery/pharmaceutical development, organic synthesis, and water quality analysis.

Resin microchannel chips, which can be manufactured at low costs, have attracted attention.

Resin microchannel chips are manufactured by joining together a resin substrate having microchannels formed on at least one side thereof and a resin lid substrate that serves as a lid material. Specifically, resin microchannel chips are manufactured by thermo-compression bonding of a resin substrate having microchannels formed thereon and a resin lid substrate by means of a press machine or a roll machine, optionally after applying surface treatment on joining surfaces of the resin substrate and resin lid substrate (see, e.g., PTLS 1 and 2).

CITATION LIST

Patent Literature

PTL 1: JP2011-214838A
PTL 2: JP2006-187730A

SUMMARY

Technical Problem

However, the conventional manufacturing methods using a press machine or a roll machine may not be able to provide a sufficient joint strength in an initial stage after manufacture. Further, the conventional manufacturing methods have a drawback of causing deformation of microchannels during joining when the pressure at the time of pressing or rolling is increased in order to obtain sufficient joint strength.

An object of the present disclosure is therefore to provide a method of manufacturing a microchannel chip, which enables manufacture of a resin microchannel chip with excellent initial joint strength after manufacture and limited deformation of microchannels.

Solution to Problem

The inventor has made extensive studies to solve the foregoing problem and established that it is possible to sufficiently increase the initial joint strength after manufacture while limiting deformation of microchannels when substrates are pressurized using a fluid or an elastic body having a durometer hardness equal to or less than a specific value. The inventor thus completed the present disclosure.

Specifically, the present disclosure aims to advantageously solve the foregoing problem, and a disclosed method of manufacturing a microchannel chip is a method of manufacturing a microchannel chip by joining together a resin channel substrate having microchannels formed on at least one side thereof and a resin lid substrate, the method including: a step (A) wherein surface modification treatment is applied on joining surfaces of the channel substrate and the lid substrate; and a step (B) wherein, after the step (A), the joining surfaces of the channel substrate and the lid substrate are mated and the channel substrate and the lid substrate are pressurized under heating via a fluid or an elastic body having a durometer hardness of E20 or less. By joining together the channel substrate and the lid substrate by pressurizing under heating via a fluid or an elastic body having a durometer hardness of E20 or less after applying surface modification treatment on the joining surfaces in this way, it is possible to sufficiently increase the initial joint strength after manufacture while limiting deformation of microchannels.

"Durometer hardness" herein can be measured using a type E durometer in accordance with JIS K6253.

In the disclosed method of manufacturing a microchannel chip, it is preferred that the channel substrate and the lid substrate are made of cyclic olefin resin. Using such a channel substrate and a lid substrate, it is possible to obtain a microchannel chip having excellent durability.

In the disclosed method of manufacturing a microchannel chip, it is preferred that, in the step (A), the surface modification treatment is applied using a silane coupling agent. When a silane coupling agent is used, it is possible to allow the channel substrate and the lid substrate to be favorably joined together, so that the initial joint strength after manufacture can be further increased. Moreover, when a silane coupling agent is used, it is possible to increase the optical stability of the manufactured microchannel chip compared to a case where surface modification treatment is applied utilizing UV irradiation or other method.

In the disclosed method of manufacturing a microchannel chip, it is preferred that, in the step (B), an autoclave is used to pressurize the channel substrate and the lid substrate via the fluid. When the channel substrate and the lid substrate are pressurized via a fluid using an autoclave, it is possible to allow the channel substrate and the lid substrate to be favorably joined together, so that limitation of deformation of microchannels and improvement of the initial joint strength after manufacture can be achieved at high levels.

In the disclosed method of manufacturing a microchannel chip, it is preferred that, in the step (B), the channel substrate and the lid substrate, placed on top of each other, are accommodated in a bag, the interior of the bag is depressurized and hermetically sealed, the channel substrate and the lid substrate hermetically sealed within the bag are placed in an autoclave, and the channel substrate and the lid substrate are pressurized via the fluid. When the channel substrate and the lid substrate accommodated in a bag are pressurized using a fluid, it is possible to limit degradation of the channel substrate and the lid substrate due to contact with the fluid. Further, when the channel substrate and the lid substrate are pressurized using a fluid after depressurizing and hermetically sealing the interior of the bag containing the channel substrate and the lid substrate, it is possible to allow the channel substrate and the lid substrate to be favorably joined together, so that the initial joint strength after manufacture can be further increased.

When the channel substrate and the lid substrate are accommodated in a bag and then the interior of the bag is depressurized and hermetically sealed in the step (B), it is particularly preferred that, in the step (A), the surface modification treatment is applied using a silane coupling agent. When a silane coupling agent is used, the condensation reaction and/or addition reaction of the silane coupling agent proceed favorably during depressurization in the step (B), allowing the channel substrate and the lid substrate to be further favorably joined together.

Advantageous Effect

According to the present disclosure, it is possible to manufacture a resin microchannel chip with excellent initial joint strength after manufacture and limited deformation of microchannels.

BRIEF DESCRIPTION OF THE DRAWINGS

In the accompanying drawings.

DETAILED DESCRIPTION

Figure 1A:
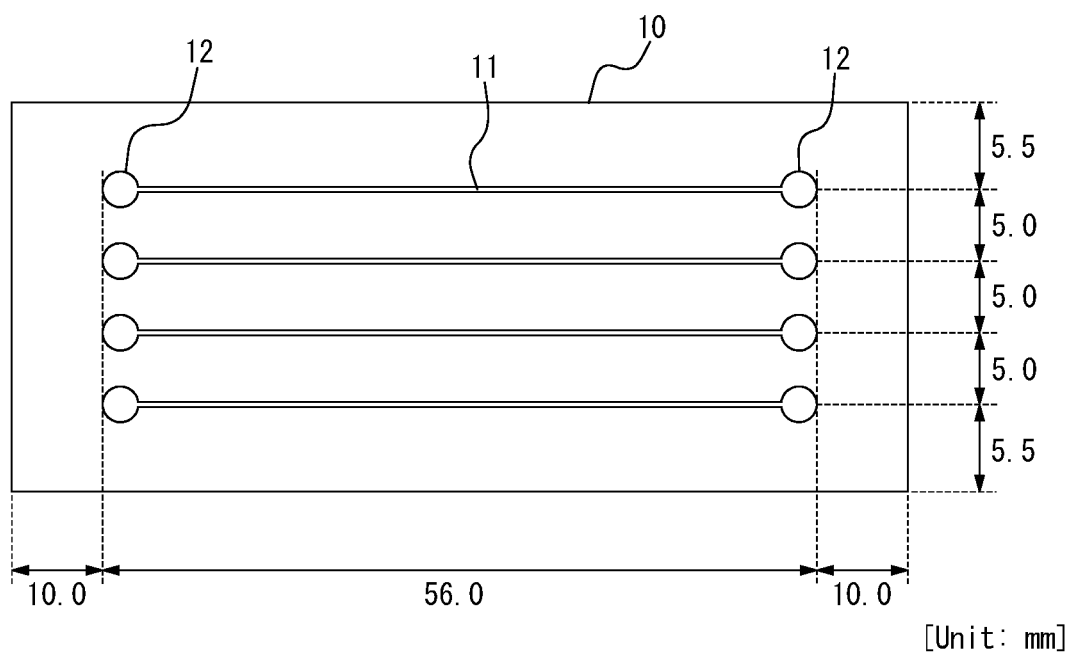
FIG. 1A is a plan view showing an example of a channel substrate of a microchannel chip.

Embodiments of the present disclosure will be described in detail below.

The disclosed method of manufacturing a microchannel chip is a method of manufacturing a resin microchannel chip. Uses of microchannel chips manufactured by the disclosed manufacturing method are not particularly limited and they can be used in various fields, including DNA testing, biological material analysis, drug discovery/pharmaceutical development, organic synthesis, and water quality analysis.

(Method of Manufacturing Microchannel Chip)

In the disclosed method of manufacturing a microchannel chip, a microchannel chip is manufactured by joining together a resin channel substrate having microchannels formed on at least one side thereof and a resin lid substrate. The disclosed manufacturing method comprises: a step (A) wherein surface modification treatment is applied on joining surfaces of the channel substrate and the lid substrate; and a step (B) wherein, after the step (A), the joining surfaces of the channel substrate and the lid substrate are mated and the channel substrate and the lid substrate are pressurized under heating via a fluid or an elastic body having a durometer hardness of E20 or less.

<Channel Substrate>

As the channel substrate, a resin substrate having microchannels formed on at least one side thereof can be used. The channel substrate is joined to a lid substrate with the side having microchannels as a joining surface.

The width, depth and shape of the microchannels can be changed as appropriate according to the applications of the microchannel chip. The microchannels are usually on the order of millimeters or smaller and may be on the order of nanometers. Preferably, the microchannels are on the order of micrometers. Specifically, the width of the microchannels is not particularly limited and can be, for example, 10 µm or more and 800 µm or less.

The formation of the microchannels on the resin substrate can be achieved for example by microprocessing techniques such as photolithography or thermal imprinting, cutting, or injection molding.

Substrates on which microchannels are to be formed are not particularly limited and substrates made of any resin can be used. For example, substrates made of cyclic olefin resin, polycarbonate resin, aromatic polyether ketone resin, (meth) acrylic resin, vinyl alicyclic hydrocarbon resin, or aromatic vinyl resin can be used. From the viewpoint of obtaining a microchannel chip excellent in durability with little decrease in joint strength with time and decrease in optical stability due to moisture absorption, as resins used to form the substrate, it is preferred to use cyclic olefin resins, more preferably cyclic olefin resins having a water absorption of 0.01% by mass or less.

Preferred examples of monomers of cyclic olefin resins are norbornene monomers. Norbornene monomers refer to monomers containing a norbornene ring. Examples of norbornene monomers include bicyclic monomers such as bicyclo[2.2.1]hept-2-ene (commonly referred to as norbornene), 5-ethylidene-bicyclo[2.2.1]hept-2-ene (commonly referred to as ethylidene norbornene), and derivatives thereof (those having substituent(s) on the ring); tricyclic monomers such as tricyclo[5.2.1.0$^{2,6}$]deca-3,8-diene (commonly referred to as dicyclopentadiene) and derivatives thereof; tetracyclic monomers such as tetracyclo[7.4.0.0$^{2,7}$.1$^{10,13}$]tetradeca-2,4,6,11-tetraene (commonly referred to as methanotetrahydrofluorene), tetracyclo[6.2.1.1$^{3,6}$.0$^{2,7}$]dodeca-4-ene (commonly referred to as tetracyclododecene), 9-ethylidenetetracyclo[6.2.1.1$^{3,6}$.0$^{2,7}$]dodeca-4-ene, and derivatives thereof; and so forth. These monomers may have a substituent at any position. Cyclic olefin resins may be addition polymers, ring opened polymers or hydrides thereof, with ring opened polymers or ring opened polymer hydrides being preferred.

The term "(meth) acrylic" herein means acrylic and/or methacrylic. "Water absorption" can be measured in accordance with ASTM D570-98.

<Lid Substrate>

As the lid substrate, any resin substrate can be used that may cover the microchannels formed on the channel substrate. Specifically, as the lid substrate, it is possible to use substrates having a smooth surface that may cover the channel substrate and optionally having through holes that, when a microchannel chip is manufactured together with the channel substrate, serve as injection ports through which a sample or the like is injected into the microchannels of the channel substrate. The lid substrate is joined to the channel substrate with the smooth surface side as a joining surface. Alternatively, as the lid substrate, such substrates may be used that have microchannels formed on a surface opposite to the smooth surface to be joined to the channel substrate.

The formation of through holes in the resin substrate can be achieved for example by microprocessing techniques such as photolithography or thermal imprinting, cutting, or injection molding.

The lid substrate is not particularly limited and substrates made of any resin can be used. For example, substrates made of cyclic olefin resin, polycarbonate resin, aromatic polyether ketone resin, (meth)acrylic resin, vinyl alicyclic hydrocarbon resin, or aromatic vinyl resin can be used. From the viewpoint of obtaining a microchannel chip excellent in durability with little decrease in joint strength with time and decrease in optical stability due to moisture absorption, as resins used to form the lid substrate, it is preferred to use cyclic olefin resins, more preferably cyclic olefin resins having a water absorption of 0.01% by mass or less.

Preferred examples of monomers of cyclic olefin resins are norbornene monomers. Norbornene monomers refer to monomers containing a norbornene ring. Examples of norbornene monomers include bicyclic monomers such as bicyclo[2.2.1]hept-2-ene (commonly referred to as norbornene), 5-ethylidene-bicyclo[2.2.1]hept-2-ene (commonly referred to as ethylidene norbornene), and derivatives thereof (those having substituent(s) on the ring); tricyclic monomers such as tricyclo[5.2.1.0$^{2,6}$]deca-3,8-diene (commonly referred to as dicyclopentadiene) and derivatives thereof; tetracyclic monomers such as tetracyclo [7.4.0.0$^{2,7}$.1$^{10,13}$]tetradeca-2,4,6,11-tetraene (commonly referred to as methanotetrahydrofluorene), tetracyclo [6.2.1.1$^{3,6}$.0$^{2,7}$]dodeca-4-ene (commonly referred to as tetracyclododecene), 9-ethylidenetetracyclo[6.2.1.1$^{3,6}$.0$^{2,7}$]dodeca-4-ene, and derivatives thereof; and so forth. These monomers may have a substituent at any position. Cyclic olefin resins may be addition polymers, ring opened polymers or hydrides thereof, with ring opened polymers or ring opened polymer hydrides being preferred.

From the viewpoint of allowing the channel substrate and the lid substrate to be favorably joined together, it is preferred that the channel substrate and the lid substrate are made of the same resin.

<Step (A)>

In the step (A), surface modification treatment is applied on the joining surface of the channel substrate and the joining surface of the lid substrate. By applying surface modification treatment, the channel substrate and the lid substrate can be favorably joined together in the step (B).

[Surface Modification Treatment]

Surface modification treatment of the joining surfaces is not particularly limited and can be achieved by any surface modification methods, such as, for example, application of a silane coupling agent, vacuum ultraviolet (VUV) irradiation, corona discharge, plasma irradiation such as atmospheric pressure plasma irradiation, or any combinations thereof. Preferably, surface modification treatment is carried out using a silane coupling agent or by vacuum ultraviolet irradiation. More preferably, surface modification treatment is carried out using a silane coupling agent. When a silane coupling agent is used, it is particularly preferred that surface modification treatment is carried out by applying a silane coupling agent after subjecting the joining surfaces to corona discharge or plasma irradiation such as atmospheric pressure plasma irradiation. Using a silane coupling agent, it is possible to allow the channel substrate and the lid substrate to be favorably joined together, so that the initial joint strength after manufacture can be sufficiently increased. Further, using a silane coupling agent, it is possible to limit reduction in the optical stability of the manufactured microchannel chip compared to a case where surface modification treatment is applied by utilizing vacuum ultraviolet irradiation or other method.

The surface modification treatment conditions can be appropriately set according to the materials of the channel substrate and the lid substrate.

Any silane coupling agents can be used herein. In particular, it is preferred to use a silane coupling agent having an amino group (e.g., 3-aminopropyltrimethoxysilane) for one of the joining surfaces of the channel substrate and the lid substrate and use a silane coupling agent having an epoxy amino group (e.g., 3-glycidoxypropyltrimethoxysilane) for the other joining surface. The combined use of a silane coupling agent having an amino group and a silane coupling agent having an epoxy group allows the channel substrate and the lid substrate to be firmly joined together by means of epoxy ring opening reactions.

<Step (B)>

In the step (B), after mating the joining surfaces of the channel substrate and the lid substrate which have been subjected to surface modification treatment in the step (A), the channel substrate and the lid substrate are pressurized under heating via a fluid or an elastic body having a durometer hardness of E20 or less, whereby the channel substrate and the lid substrate are joined together. In particular, in the step (B), it is preferred to pressurize the channel substrate and the lid substrate via a fluid from the viewpoint of sufficiently increasing the initial joint strength after manufacture.

Because the channel substrate and the lid substrate are pressurized under heating via a fluid or an elastic body having a durometer hardness of E20 or less in the step (B), it is possible to obtain a microchannel chip having a sufficiently high initial joint strength after manufacture while limiting the deformation of microchannels. The mechanism of the foregoing is not clear, but a possible mechanism is as follows. Specifically, because the channel substrate and the lid substrate have fine irregularities and/or distortions on their surface (surface to be pressurized) and thickness variations, when a laminate of the channel substrate and the lid substrate is pressurized using a press machine or a roll machine, the press head of the press machine or the roll of the roll machine cannot favorably follow the surfaces of the channel substrate and the lid substrate, resulting in failure to evenly apply a pressure over the entire surfaces of the channel substrate and the lid substrate. For this reason, it is not possible to obtain a microchannel chip having a sufficiently high initial joint strength after manufacture unless a high pressure is loaded. On the other hand, when a high pressure is loaded, there is a concern that microchannels deform. However, when pressurization is carried out via a fluid or an elastic body having a durometer hardness of E20 or less, the press head or roll favorably follows the entire surfaces of the channel substrate and the lid substrate, allowing a pressure to be evenly applied over the entire surfaces of the channel substrate and the lid substrate. For this reason, it is possible to obtain a microchannel chip having a sufficiently high initial joint strength after manufacture without having to load an excessively high pressure. It is thus possible to obtain a microchannel chip having a sufficiently high initial joint strength after manufacture while limiting the deformation of microchannels.

[Mating]

Mating of the joining surfaces of the channel substrate and the lid substrate which have been subjected to surface modification treatment is carried out with the channel substrate and the lid substrate being aligned with each other by any means, usually without using any adhesive member such as an adhesive disposed between the joining surfaces. This is because there is concern that microchannels of desired shape cannot be obtained due to entry of the adhesive member into the microchannels.

[Pressurization Under Heating Via Fluid]

When a laminate of the channel substrate and the lid substrate obtained by mating their joining surfaces is pressurized via a fluid under heating, the laminate can be pressurized via a pressurized fluid by using any means, e.g., by using a pressurizing device such as an autoclave or a warm water laminator. In particular, from the viewpoint of efficiently heating and pressurizing the laminate of the channel substrate and the lid substrate and allowing the channel substrate and the lid substrate to be favorably joined together so that that limitation of deformation of microchannels and improvement of the initial joint strength after manufacture are achieved at high levels, it is preferred to heat and pressurize the laminate using an autoclave.

When an autoclave is used to pressurize the laminate of the channel substrate and the lid substrate under heating via a fluid, it is preferred to pressurize the laminate after accommodating it into a bag and depressurizing and hermetically sealing the interior of the bag. When the channel substrate and the lid substrate accommodated in a bag are placed in an autoclave and then pressurized using a fluid, it is possible to prevent direct contact of the fluid with the channel substrate and the lid substrate, so that degradation of the channel substrate and the lid substrate due to oxygen and/or other substance contained in the fluid can be limited. Further, when the channel substrate and the lid substrate are pressurized using a fluid after depressurizing and hermitically sealing the interior of the bag into which they have been accommodated, it is possible to prevent entry of the fluid into microchannels during heating and pressurization to thereby favorably load a pressure on the channel substrate and the lid substrate, allowing the channel substrate and the lid substrate to be favorably joined together to further increase the initial joint strength after manufacture.

Particularly when a silane coupling agent has been used for surface modification treatment in the step (A), it preferred to heat and pressurize the channel substrate and the lid substrate after accommodating them in a bag and depressurizing and hermitically sealing the interior of the bag. When the channel substrate and the lid substrate whose joining surface has been modified with a silane coupling are accommodated in a bag and then the interior of the bag is depressurized, the condensation reaction and/or addition reaction of the silane coupling agent proceed favorably during depressurization, allowing the channel substrate and the lid substrate to be further favorably joined together.

—Fluid—

The fluid is not particularly limited and liquids such as water or oil, gases such as air or steam, or mixtures thereof can be used.

—Bag—

As the bag for optionally accommodating therein a laminate of the channel substrate and the lid substrate in the step (B), any bag can be used as long as the interior of the bag can be depressurized and hermetically sealed.

The interior of the bag in which a laminate of the channel substrate and the lid substrate is accommodated can be depressurized to any desired pressure. Preferably, the interior of the bag is depressurized to, for example, 10 kPa or less (absolute pressure), and more preferably to 2 kPa or less (absolute pressure). When the interior pressure of the bag is reduced to the upper limit value or less above upon depressurization, it is possible to favorably apply a load on the channel substrate and the lid substrate to further increase the initial joint strength after manufacture.

—Heating—

In the step (B), heating of the laminate of the channel substrate and the lid substrate is usually carried out at a temperature lower than the deflection temperature under load of the resin used as the material of the channel substrate and the lid substrate, preferably at a temperature 20° C. below the deflection temperature under load or lower, and more preferably at a temperature 30° C. below the deflection temperature under load or lower, but preferably at a temperature 80° C. below the deflection temperature under load or higher, more preferably at a temperature 60° C. below the deflection temperature under load or higher, and even more preferably at a temperature 40° C. below the deflection temperature under load or higher. When the heating temperature is set to the upper limit value or less, deformation of the microchannels can be sufficiently limited. When the heating temperature is set to the lower limit value or more, the initial joint strength after manufacture can be sufficiently increased.

"Deflection temperature under load" herein can be measured in accordance with JIS 7191 (flatwise, method A).

—Pressurization—

In the step (B), the pressure applied when pressurizing the laminate of the channel substrate and the lid substrate via the fluid is not particularly limited and is preferably set to, for example, 0.2 MPa or more, more preferably 0.5 MPa or more, and even more preferably 0.7 MPa or more, but preferably 1.5 MPa or less, and more preferably 1.0 MPa or less. When the pressure is set to the upper limit value or less, deformation of the microchannels can be sufficiently limited. When the pressure is set to the lower limit value or more, it is possible to sufficiently increase the initial joint strength after manufacture.

[Pressurization Via Elastic Body Under Heating]

When a laminate of the channel substrate and the lid substrate obtained by mating their joining surfaces is to be pressurized via an elastic body under heating, an elastic body having a durometer hardness of E20 or less is used. The laminate to be pressurized via the elastic body may or may not be accommodated in a bag which has been depressurized and hermitically sealed.

—Elastic Body—

As the elastic body, it is necessary to use an elastic body having a durometer hardness of E20 or less, and the durometer hardness of the elastic body is preferably E5 or less. When the durometer hardness of the elastic body is set to the upper limit value or less, it is possible to manufacture a resin microchannel chip with excellent initial joint strength after manufacture and limited deformation of microchannels.

—Heating—

When an elastic body is used, as in the case of using a fluid, heating of the laminate of the channel substrate and the lid substrate is usually carried out at a temperature lower than the deflection temperature under load of the resin used as the material of the channel substrate and the lid substrate, preferably at a temperature 20° C. below the deflection temperature under load or lower, and more preferably at a temperature 30° C. below the deflection temperature under load or lower, but preferably at a temperature 80° C. below the deflection temperature under load or higher, more preferably at a temperature 60° C. below the deflection temperature under load or higher, and even more preferably at a temperature 40° C. below the deflection temperature under load or higher. When the heating temperature is set to the upper limit value or less, deformation of the microchannels can be sufficiently limited. When the heating temperature is set to the lower limit value or more, the initial joint strength after manufacture can be sufficiently increased.

—Pressurization—

When an elastic body is used, pressurization of the laminate of the channel substrate and the lid substrate via the elastic body can be carried out by pressing the laminate in the lamination direction using the elastic body disposed on at least one side in the lamination direction of the laminate. The pressure applied when pressurizing the laminate via the elastic body is not particularly limited and is preferably set to, for example, 0.2 MPa or more, more preferably 0.5 MPa or more, and even more preferably 0.7 MPa or more, but preferably 1.5 MPa or less, and more preferably 1.0 MPa or less. When the pressure is set to the upper limit value or less, deformation of the microchannels can be sufficiently limited. When the pressure is set to the lower limit value or more, the initial joint strength after manufacture can be sufficiently increased.

Pressurization using an elastic body as described above can be carried out for example using a commercially available pressurization apparatus (e.g., a press machine with elastic head, such as "Iso-Bonder & Dry-Laminator" manufactured by Nikkiso Co., Ltd.).

EXAMPLES

The present disclosure will be described in more detailed based on Examples, which however shall not be construed as limiting the scope of the present disclosure.

The performance of the microchannel chips manufactured in Examples and Comparative Examples was evaluated by the methods described below.

<Initial Joint Strength>

For the specimen manufactured for joint strength measurement, a three-point flexural test was carried out in accordance with JIS K7171 except that the distance between supporting points on a support stage was set to 60 mm. The specimen was placed at the center of the support stage with the channel substrate on the indenter side and the lid substrate for joint strength measurement on the support stage side.

For each example five specimens were subjected to the three-point flexural test and the average value of maximum load (corresponding to the load when the joining surfaces were separated) was recorded as joint strength, which was evaluated based on the criteria given below. A larger joint strength indicates a better initial joint strength after manufacture.

A: Joint strength is 15N or more
B: Joint strength is 5N or more and less than 15N
C: Joint strength is less than 5 N
D: Substrate separation occurred during handling <Liquid Seepage>

For five samples of the manufactured microchannel chip, aqueous ink solution was injected from injection ports into respective channels using a micropipette. Seepage of the ink aqueous solution from the channels into the joint was visually investigated.

<Flow Rate Variation>

For 10 samples of the manufactured microchip, 2.0 µL of aqueous ink solution was injected from one injection port into each channel using a micropipette. For each channel the time it took for the injected solution to reach the other injection port was measured, and a variation coefficient was calculated from the average value and the standard deviation and evaluated based on the criteria given below. A larger variation coefficient indicates more incidences of channel deformation during the manufacturing process and therefore larger variations in flow rate among the channels.

A: Variation coefficient is less than 5%
B: Variation coefficient is 5% or more and less than 10%
C: Variation coefficient is 10% or more <Joint Strength after Durability Test>

For durability test, the specimen manufactured for joint strength measurement was exposed to a constant temperature and humidity environment at 60° C. and 90% relative humidity under an atmospheric pressure for 168 hours (one week).

The joint strength after the durability test was measured in the same manner as described in <Initial Joint Strength> above and evaluated based on the criteria given below. A larger joint strength after the durability test indicates that the manufactured microchip exerts a better joint strength over a long period of time.

A: Joint strength is 15N or more
B: Joint strength is 5N or more and less than 15N
C: Joint strength is less than 5 N <Optical Stability>

For five samples of the manufactured microchannel chip, light transmittance at 400 nm wavelength was measured using a UV-visible spectrophotometer (UV-VIS V570, manufactured by JASCO Corporation) at a joint surface part where channels were not formed.

For durability test, the microchannel chip was then exposed to a constant temperature and humidity environment at 60° C. and 90% relative humidity under an atmospheric pressure for 168 hours (one week).

For the microchannel chip after the durability test, light transmittance at 400 nm wavelength was measured in the same manner as described above and then % change in light transmittance before and after durability test (=(average light transmittance after durability test−average initial light transmittance)/average initial light transmittance×100)) was calculated and evaluated based on the criteria given below. A smaller % change in light transmittance indicates a smaller change in appearance with time and therefore better optical stability.

A: % change is less than 2%
B: % change is 2% or more

Example 1

<Preparation of Substrates>

A pattern of four channels 11 (each 200 µm in width and 100 µm in depth) such as that illustrated in FIG. 1A was formed on one side of a resin substrate (1.0 mm thick×76.0 mm length×26.0 mm width) made of cyclic olefin resin (COP) (ZEONEX® 690R (ZEONEX is a registered trademark in Japan, other countries, or both), manufactured by ZEON Corporation, a hydrogenated ring-opened polymer of a norbornene monomer with a deflection temperature under load of 136° C. and a water absorption of 0.01% by mass or less). In this way a channel substrate 10 was manufactured.

Figure 1B:
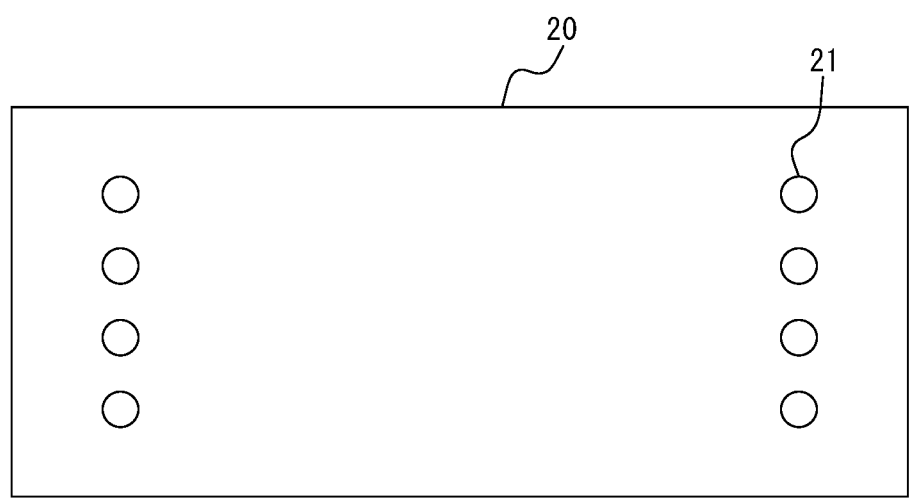
FIG. 1B is a plan view showing an example of a lid substrate of a microchannel chip.

A total of 8 through holes 21 (injection ports) of 2.0 mm diameter were formed as illustrated in FIG. 1B in a resin substrate (1.0 mm thick×76.0 mm length×26.0 mm width) made of cyclic olefin resin (ZEONEX® 690R (ZEONEX is a registered trademark in Japan, other countries, or both), manufactured by ZEON Corporation, a hydrogenated ring-opened polymer of a norbornene monomer with a deflection temperature under load of 136° C. and a water absorption of 0.01% by mass or less). In this way a lid substrate 20 was manufactured. The through holes 21 were formed at positions corresponding to terminals 12 of the channels 11 of the channel substrate 10.

<Surface Modification Treatment>

Using a normal-pressure plasma surface treatment device (AP-T03-L, manufactured by Sekisui Chemical Co., Ltd.), the surface having the channels 11 (joining surface) of the channel substrate 10 was irradiated with atmospheric pressure plasma (output=1.5 kW, frequency=25 kHz, nitrogen gas flow rate=50 L/min, irradiation rate=30 cm/min) and then coated with aminopropyltrimethoxysilane (KBM-903, manufactured by Shin-Etsu Chemical Co., Ltd.) as a silane coupling agent. In this way surface modification treatment was carried out. One side (joining surface) of the lid substrate 20 was irradiated with atmospheric pressure plasma as with the channel substrate 10 and then coated with glycidoxypropyltrimethoxysilane (KBM-403, manufactured by Shin-Etsu Chemical Co., Ltd.) as a silane coupling agent. In this way surface modification treatment was carried out.

<Joining>

A laminate of the channel substrate 10 and the lid substrate 20 was obtained by joining together the joining surfaces of the channel substrate 10 and the lid substrate 20 such that the terminals 12 of the channels 11 were aligned with the through holes 20.

The laminate obtained was then accommodated in a bag made of polyethylene terephthalate (PET) film/biaxially oriented nylon (ONY) film/cast polypropylene (CPP) film, and the interior of the bag was depressurized to 1 kPa (absolute pressure) using a vacuum packaging machine and hermitically sealed by closing the opening with a heat seal.

The laminate contained in the bag was placed into an autoclave and heated and pressurized at 100° C. (36° C. below the deflection temperature under load) and at a pressure of 0.8 MPa for 30 minutes in an air atmosphere. In this way the channel substrate 10 and the lid substrate 20 were joined together.

The microchannel chip obtained by joining together the channel substrate 10 and the lid substrate 20 was subjected to various evaluations. The results are shown in Table 1.

<Preparation of Specimen for Joint Strength Measurement>

In the same manner as described above, a channel substrate 10 was prepared and surface modification treatment was applied on a surface having channels 11 formed thereon (joining surface).

As a lid substrate for joint strength measurement, a resin substrate (1.0 mm thick×40.0 mm length×26.0 mm width) made of cyclic olefin resin (ZEONEX® 690R (ZEONEX is a registered trademark in Japan, other countries, or both), manufactured by ZEON Corporation, a hydrogenated ring-opened polymer of a norbornene monomer with a deflection temperature under load of 136° C. and a water absorption of 0.01% by mass or less) was prepared. One side (joining surface) of the lid substrate for joint strength measurement was then irradiated with atmospheric pressure plasma as with the channel substrate 10 and then coated with glycidoxypropyltrimethoxysilane (KBM-403, manufactured by Shin-Etsu Chemical Co., Ltd.) as a silane coupling agent. In this way surface modification treatment was carried out.

A specimen for joint strength measurement was obtained by joining together the channel substrate 10 and the lid substrate in the same manner as described above except that the joining surfaces of the channel substrate 10 and the lid substrate were mated such that the center positions in the longitudinal direction of the substrates were aligned with each other to form a laminate. Using this specimen, joint strength was evaluated. The results are shown in Table 1.

Example 2

A microchannel chip and a specimen for joint strength measurement were manufactured as in Example 1 except that a channel substrate and a lid substrate were joined together as follows: upon joining, a laminate not accommodated in a bag was heated and pressurized in the lamination direction at 100° C. (36° C. below the deflection temperature under load) and at a pressure of 0.8 MPa for 30 minutes using, instead of an autoclave, a press with elastic head having an elastic body (durometer hardness of E5) provided between the pressure head and workpiece. Various evaluations were made as in Example 1. The results are shown in Table 1.

Example 3

A microchannel chip and a specimen for joint strength measurement were manufactured as in Example 1 except that upon surface modification treatment, the joining surfaces were irradiated with vacuum ultraviolet radiation (emission wavelength=172 nm, irradiation distance=5 mm, irradiation intensity=10 mW/cm², irradiation time=10 minutes) instead of atmospheric pressure plasma irradiation plus silane coupling agent application. Various evaluations were made as in Example 1. The results are shown in Table 1.

Examples 4 and 5

Microchannel chips and specimens for joint strength measurement were manufactured as in Example 1 except that the temperature upon joining was changed to 120° C. (16° C. below the deflection temperature under load) (Example 4) or to 70° C. (66° C. below the deflection temperature under load) (Example 5). Various evaluations were made as in Example 1. The results are shown in Table 1.

Example 6

A microchannel chip and a specimen for joint strength measurement were manufactured as in Example 1 except that the interior pressure of the bag upon joining was changed to 15 KPa (absolute pressure). Various evaluations were made as in Example 1. The results are shown in Table 1.

Example 7

A microchannel chip and a specimen for joint strength measurement were manufactured as in Example 1 except that upon preparation of substrates, resin substrates (1.0 mm thick×76.0 mm length×26.0 mm width or 1.0 mm thick×40.0 mm length×26.0 mm width) made of polycarbonate (PC) resin (Lupilon H-4000, manufactured by Mitsubishi Chemical Corporation, with a deflection temperature under load of 136° C. and a water absorption of 0.24% by mass) were used instead of resin substrates made of cyclic olefin resin. Various evaluations were made as in Example 1. The results are shown in Table 1.

Comparative Example 1

A microchannel chip and a specimen for joint strength measurement were manufactured as in Example 1 except that a channel substrate and a lid substrate were joined together as follows: upon joining, a laminate not accommodated in a bag was heated and pressurized in the lamination direction at 100° C. (36° C. below the deflection temperature under load) and at a pressure of 0.8 MPa for 30 minutes using, instead of an autoclave, a flat plate press (pressure head: metal plate). Various evaluations were made as in Example 1. Flow rate variation could not be evaluated due to liquid leakage. The results are shown in Table 1.

Comparative Example 2

A microchannel chip and a specimen for joint strength measurement were manufactured as in Comparative Example 1 except that the pressure upon joining was changed to 5.0 MPa. Various evaluations were made as in Example 1. The results are shown in Table 1.

Comparative Example 3

A microchannel chip and a specimen for joint strength measurement were manufactured as in Example 1 except that surface modification treatment was not carried out. Various evaluations were made as in Example 1. Except for the evaluation of initial joint strength, evaluations failed because separation between the channel substrate the lid substrate occurred. The results are shown in Table 1.

Comparative Example 4

A microchannel chip and a specimen for joint strength measurement were manufactured as in Example 2 except that the durometer hardness of an elastic body was changed to E25. Various evaluations were made as in Example 1. The results are shown in Table 1. Flow rate variation could not be evaluated due to liquid leakage. The results are shown in Table 1.

TABLE 1

|  |  | Ex. 1 | Ex. 2 | Ex. 3 | Ex. 4 | Ex. 5 | Ex. 6 |
|---|---|---|---|---|---|---|---|
| Channel substrate resin | | COP | COP | COP | COP | COP | COP |
| Lid substrate resin | | COP | COP | COP | COP | COP | COP |
| Surface modification treatment | Treatment method | Atmospheric plasma + silane coupling agent | Atmospheric plasma + silane coupling agent | Vacuum UV | Atmospheric plasma + silane coupling agent | Atmospheric plasma + silane coupling agent | Atmospheric plasma + silane coupling agent |
| Heating | Temperature [° C.] (diffirence from the deflection temperature under load of resin) | 100 (−36) | 100 (−36) | 100 (−36) | 120 (−16) | 70 (−66) | 100 (−36) |
| Pressurization | Pressurizing method | Autoclave (in bag: 1 kPa) | Press with elastic head (hardness: E5) | Autoclave (in bag: 1 kPa) | Autoclave (in bag: 1 kPa) | Autoclave (in bag: 1 kPa) | Autoclave (in bag: 15 kPa) |
|  | Pressure [MPa] | 0.8 | 0.8 | 0.8 | 0.8 | 0.8 | 0.8 |
| Evaluations | Initial joint strength | A | A | B | A | B | B |
|  | Liquid seepage | Not occurred | Not occurred | Not occurred | Not occurred | Not occurred | Not occurred |
|  | Flow rate variation | A | B | A | B | A | A |
|  | Joint strength after durability test | A | A | B | A | B | B |
|  | Optical stability | A | A | B | A | A | A |

|  |  | Ex. 7 | Comp. Ex. 1 | Comp. Ex. 2 | Comp. Ex. 3 | Comp. Ex. 4 |
|---|---|---|---|---|---|---|
| Channel substrate resin | | PC | COP | COP | COP | COP |
| Lid substrate resin | | PC | COP | COP | COP | COP |
| Surface modification treatment | Treatment method | Atmospheric plasma + silane coupling agent | Atmospheric plasma + silane coupling agent | Atmospheric plasma + silane coupling agent | Not performed | Atmospheric plasma + silane coupling agent |
| Heating | Temperature [° C.] (diffirence from the deflection temperature under load of resin) | 100 (−36) | 100 (−36) | 100 (−36) | 100 (−36) | 100 (−36) |
| Pressurization | Pressurizing method | Autoclave (in bag: 1 kPa) | Flat press machine | Flat press machine | Autoclave (in bag: 1 kPa) | Press with elastic head (hardness: E25) |
|  | Pressure [MPa] | 0.8 | 0.8 | 5.0 | 0.8 | 0.8 |
| Evaluations | Initial joint strength | A | C | A | D | B |
|  | Liquid seepage | Not occurred | Occurred | Not occurred | Measurement failed | Occurred |
|  | Flow rate variation | A | Measurement failed | C | Measurement failed | Measurement failed |
|  | Joint strength after durability test | C | C | A | Measurement failed | B |
|  | Optical stability | B | A | A | Measurement failed | A |

As seen from Table 1, Examples 1 to 7 were able to provide a resin microchannel chip with excellent initial joint strength after manufacture and limited deformation of microchannels. In contrast, it can be seen that Comparative Examples 1 and 3 caused a reduction in initial joint strength after manufacture and Comparative Example 2 was not able to limit deformation of microchannels. It can also be seen that Comparative Examples 1 and 4 were not able to favorably join the channel substrate and the lid substrate together and hence caused liquid seepage.

INDUSTRIAL APPLICABILITY

According to the present disclosure, it is possible to manufacture a resin microchannel chip with excellent initial joint strength after manufacture and limited deformation of microchannels.

REFERENCE SIGNS LIST

10 Channel substrate
11 Channel
12 Terminal
20 Lid substrate
21 Through hole

The invention claimed is:

1. A method of manufacturing a microchannel chip by joining together a resin channel substrate having microchannels formed on at least one side thereof and a resin lid substrate, the method comprising:
   a step (A) wherein surface modification treatment is applied on joining surfaces of the channel substrate and the lid substrate; and
   a step (B) wherein, after the step (A), the joining surfaces of the channel substrate and the lid substrate are mated and the channel substrate and the lid substrate are pressurized under heating via a fluid or an elastic body having a durometer hardness of E20 or less, wherein
   in the step (A), the surface modification treatment is applied using 3-aminopropyltrimethoxysilane for the joining surface of one of the channel substrate and the lid substrate and using 3-glycidoxypropyltrimethoxysilane for the joining surface of the other of the channel substrate and the lid substrate, and
   the durometer hardness is measured using a type E durometer in accordance with JIS K6253.

2. The method of manufacturing a microchannel chip according to claim 1, wherein the channel substrate and the lid substrate are made of cyclic olefin resin.

3. The method of manufacturing a microchannel chip according to claim 1, wherein, in the step (B), an autoclave is used to pressurize the channel substrate and the lid substrate via the fluid.

4. The method of manufacturing a microchannel chip according to claim 3, wherein, in the step (B), the channel substrate and the lid substrate, placed on top of each other, are accommodated in a bag, the interior of the bag is depressurized and hermetically sealed, the channel substrate and the lid substrate hermetically sealed within the bag are placed in the autoclave, and the channel substrate and the lid substrate are pressurized via the fluid.

* * * * *